(12) United States Patent
Yudovsky et al.

(10) Patent No.: US 11,222,809 B2
(45) Date of Patent: Jan. 11, 2022

(54) PATTERNED VACUUM CHUCK FOR DOUBLE-SIDED PROCESSING

(71) Applicant: Applied Materials, Inc., Santa Clara, CA (US)

(72) Inventors: Joseph Yudovsky, Campbell, CA (US); Visweswaren Sivaramakrishnan, Cupertino, CA (US); Ludovic Godet, Sunnyvale, CA (US); Rutger Meyer Timmerman Thijssen, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/993,069

(22) Filed: Aug. 13, 2020

(65) Prior Publication Data

US 2020/0373188 A1    Nov. 26, 2020

Related U.S. Application Data

(62) Division of application No. 16/260,675, filed on Jan. 29, 2019, now abandoned.

(60) Provisional application No. 62/632,867, filed on Feb. 20, 2018.

(51) Int. Cl.
   *H01L 21/683* (2006.01)
   *G03F 7/20* (2006.01)
   *H01L 21/687* (2006.01)

(52) U.S. Cl.
   CPC .......... *H01L 21/6838* (2013.01); *G03F 7/707* (2013.01); *H01L 21/6875* (2013.01)

(58) Field of Classification Search
   CPC . H01L 21/6838; H01L 21/6875; G03F 7/707; Y10T 279/11
   See application file for complete search history.

(56) References Cited

U.S. PATENT DOCUMENTS

| | | | |
|---|---|---|---|
| 3,729,206 A | 4/1973 | Cachon et al. | |
| 5,374,829 A | 12/1994 | Sakamoto et al. | |
| 5,761,023 A | 6/1998 | Lue et al. | |
| 5,976,260 A | 11/1999 | Kinoshita et al. | |
| 5,989,760 A | 11/1999 | Mangat et al. | |

(Continued)

FOREIGN PATENT DOCUMENTS

| | | |
|---|---|---|
| JP | 2014225489 A | 12/2014 |
| KR | 10-20160020352 A | 2/2016 |
| TW | 201607082 A | 2/2016 |

OTHER PUBLICATIONS

Taiwan Office Action in related application TW 108105609 dated Mar. 15, 2021.

(Continued)

*Primary Examiner* — Eric A. Gates
(74) *Attorney, Agent, or Firm* — Patterson + Sheridan, LLP

(57) ABSTRACT

Embodiments described herein relate to a substrate chucking apparatus having a plurality of cavities formed therein. The cavities are formed in a body of the chucking apparatus. In one embodiment, a first plurality of ports are formed in a chucking surface of the body and extend to a bottom surface of the body. In another embodiment, a second plurality of ports are formed in a bottom surface of the plurality of cavities and extend through the body to a bottom surface of the body.

20 Claims, 8 Drawing Sheets

(56) References Cited

U.S. PATENT DOCUMENTS

| | | | |
|---|---|---|---|
| 6,716,084 B2* | 4/2004 | Basol | B24B 37/30 |
| | | | 451/288 |
| 7,019,819 B2 | 3/2006 | Choi et al. | |
| 7,576,018 B2 | 8/2009 | Funk | |
| 7,635,263 B2 | 12/2009 | Cherala et al. | |
| 7,722,256 B2* | 5/2010 | Brackley | H01L 21/6838 |
| | | | 384/12 |
| 7,798,801 B2 | 9/2010 | Babbs et al. | |
| 8,109,753 B2 | 2/2012 | Choi et al. | |
| 8,138,456 B2 | 3/2012 | Fukuda et al. | |
| 8,616,539 B2* | 12/2013 | Tseng | H01L 21/6838 |
| | | | 269/21 |
| 8,705,008 B2 | 4/2014 | Shibazaki | |
| 8,832,924 B2 | 9/2014 | Mizubata | |
| 8,851,133 B2 | 10/2014 | Liu et al. | |
| 9,013,682 B2* | 4/2015 | Compen | G03F 7/70783 |
| | | | 355/72 |
| 9,164,375 B2 | 10/2015 | Ganapathisubramanian et al. | |
| 10,335,984 B2 | 7/2019 | Choi et al. | |
| 10,643,879 B2 | 5/2020 | Hsu et al. | |
| 2004/0163601 A1* | 8/2004 | Kadotani | H01L 21/67109 |
| | | | 118/728 |
| 2005/0035514 A1 | 2/2005 | Hillman et al. | |
| 2006/0172031 A1 | 8/2006 | Babbs et al. | |
| 2007/0190200 A1 | 8/2007 | Cherala et al. | |
| 2008/0117551 A1 | 5/2008 | Brackley et al. | |
| 2010/0195080 A1 | 8/2010 | Compen et al. | |
| 2011/0155008 A1 | 6/2011 | Shizawa et al. | |
| 2011/0292369 A1* | 12/2011 | Lafarre | G03F 7/707 |
| | | | 355/72 |
| 2013/0156947 A1 | 6/2013 | Tseng et al. | |
| 2014/0191478 A1 | 7/2014 | Oremus | |
| 2015/0072505 A1 | 3/2015 | Liu et al. | |
| 2016/0020352 A1 | 1/2016 | Konstantatos et al. | |
| 2017/0282439 A1 | 10/2017 | Lu et al. | |

OTHER PUBLICATIONS

International Search Report and Written Opinion for Application No. PCT/US2019/015569 dated May 15, 2019.
Taiwan Office Action for Application No. TW 108105609 dated Nov. 7, 2019.
Taiwan Office Action for Application No. 108105609 dated Mar. 18, 2020.
Supplementary European Search Report for Application No. EP 19 75 7895 dated Oct. 11, 2021.
Japanese Office Action for Application No. 2020-544293 dated Nov. 2, 2021.
Korean Notice of Allowance for Application No. 10-2020-7026834 dated Nov. 26, 2021.

* cited by examiner

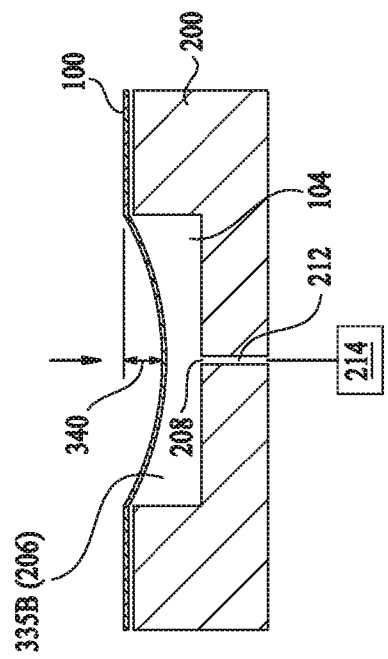
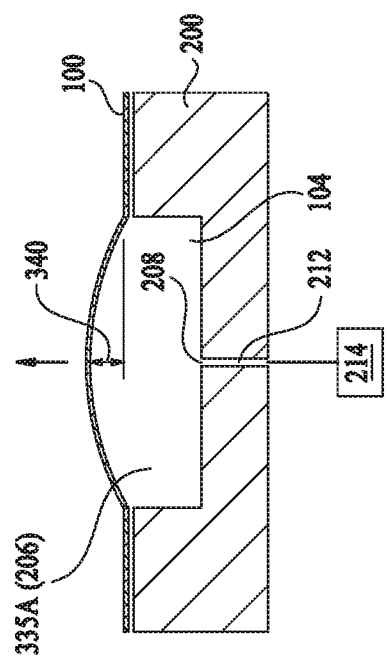

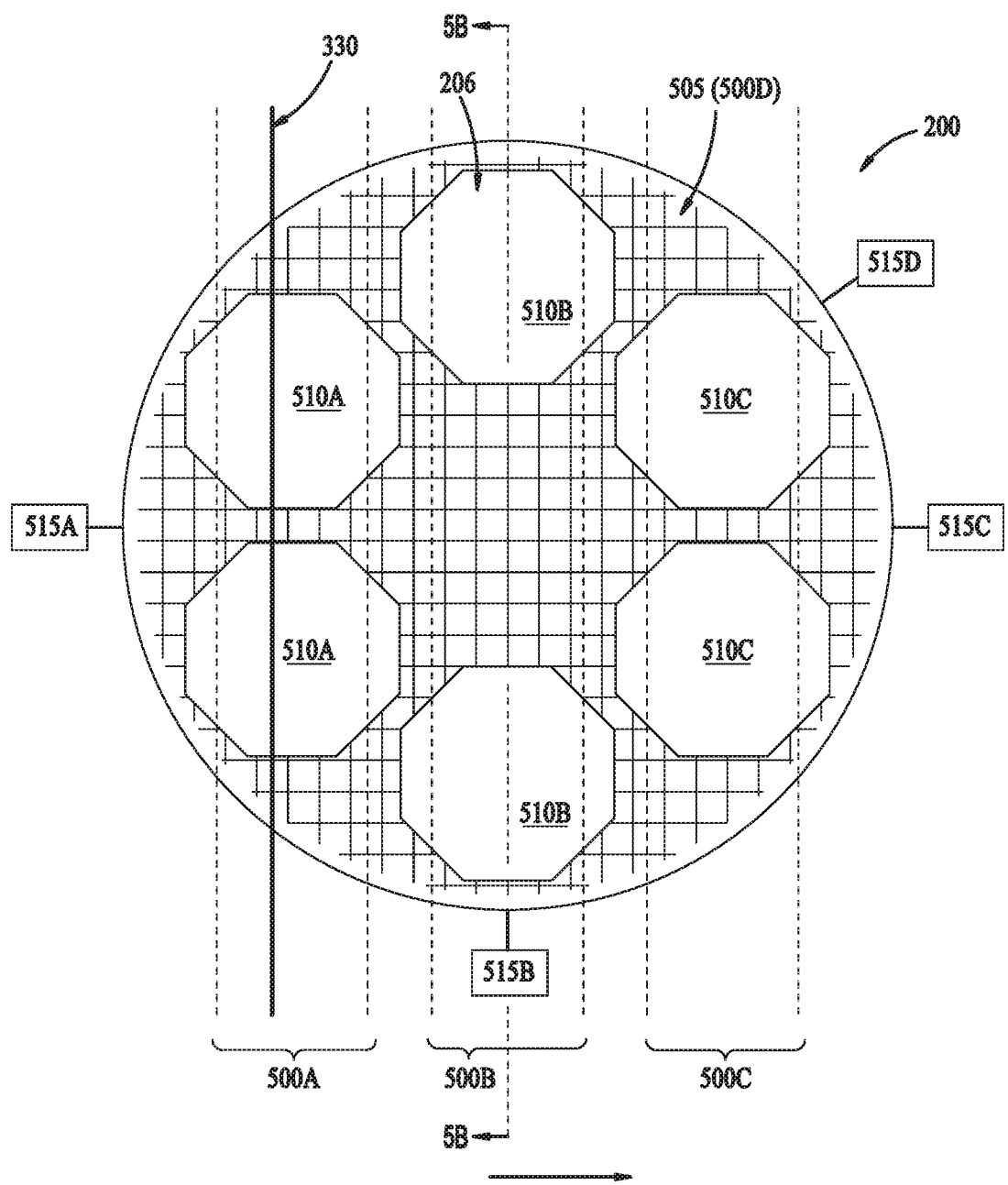

PATTERNED VACUUM CHUCK FOR DOUBLE-SIDED PROCESSING

CROSS-REFERENCE TO RELATED APPLICATION

This application is a divisional of U.S. patent application Ser. No. 16/260,675, filed Jan. 29, 2019, which claims benefit of U.S. Provisional Patent Application Ser. No. 62/632,867, filed Feb. 20, 2018, both of which are hereby incorporated by reference herein.

BACKGROUND

Field

Embodiments of the present disclosure generally relate to a substrate chuck. More specifically, embodiments described herein relate to a patterned vacuum chuck.

Description of the Related Art

Substrate chucking apparatus are commonly used in the semiconductor and display industries to support a substrate during transfer or processing of the substrate. Emerging technologies have lead to the development of various advanced processing techniques for device and structure fabrication on substrates. For example, fabrication of a waveguide apparatus for virtual reality and augmented reality applications has pushed the boundaries of conventional substrate processing techniques.

Waveguide apparatus incorporate microstructures formed on a glass or glass-like substrate. Often, microstructures are formed on a front side of the substrate and a backside of the substrate. However, handling and supporting a substrate with microstructures formed on the front and back of the substrate during processing is challenging. For example, conventional chucking apparatus may damage microstructures formed on a backside of the substrate while the front side is being processed, or vice versa.

Thus, what is needed in the art are improved chucking apparatus.

SUMMARY

Embodiments described herein relate to a substrate chucking apparatus and method of chucking a substrate. In one embodiment, the substrate chucking apparatus includes a body having a chucking surface and a bottom surface opposite the chucking surface. The body includes a plurality of cavities formed therein that are recessed from the chucking surface, wherein pairs of the plurality of cavities are in fluid communication with a plurality of first conduits. The apparatus also includes a plurality of second conduits formed in the body, one of the plurality of second conduits formed between a portion of the plurality of cavities, wherein a pressure in pairs of the cavities is individually controlled.

In another embodiment, a substrate chucking apparatus includes a circular body having a chucking surface, a plurality of cavities formed in the chucking surface, a plurality of first conduits, each of the plurality of first conduits coupled to a surface port formed in the chucking surface, a second conduit coupled to a first pair of the plurality of cavities, a third conduit coupled to a second pair of the plurality of cavities, and a fourth conduit coupled to a third pair of the plurality of cavities, wherein a pressure in each of the pairs of the cavities is individually controlled In another embodiment, a method for processing a substrate is described that includes forming a plurality of structures on a first major surface of the substrate, positioning the first major surface on a chuck, wherein each of the plurality of structures are positioned in a respective cavity formed in a chucking surface of the chuck, and applying a first pressure to the major surface through a plurality of surface ports while applying a second pressure in pairs of the cavities, the first pressure being different than the second pressure.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 3B and 3C are sectional view of portions of the vacuum chucking apparatus having a substrate thereon.

FIG. 5A illustrates a plan view of the vacuum chucking apparatus of FIG. 2 according to an embodiment described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to a substrate chucking apparatus having a plurality of cavities formed therein. A portion of the cavities are utilized to receive a microstructure previously formed on one major side of a substrate which is chucked to the cucking apparatus, and enabling formation of microstructures on another major side of the substrate. The chucking apparatus may be particularly useful in lithography processes, for example, nanoimprint lithography (NIL) processes, such as substrate conformal imprint lithography (SCIL). While some embodiments are exemplarily described for use with an SCIL process, the disclosure is not limited to the SCIL process and may be utilized with other NIL processes. Other NIL processes include using a roller that contacts a flexible template for transferring a pattern to a substrate.

Figure 1A:
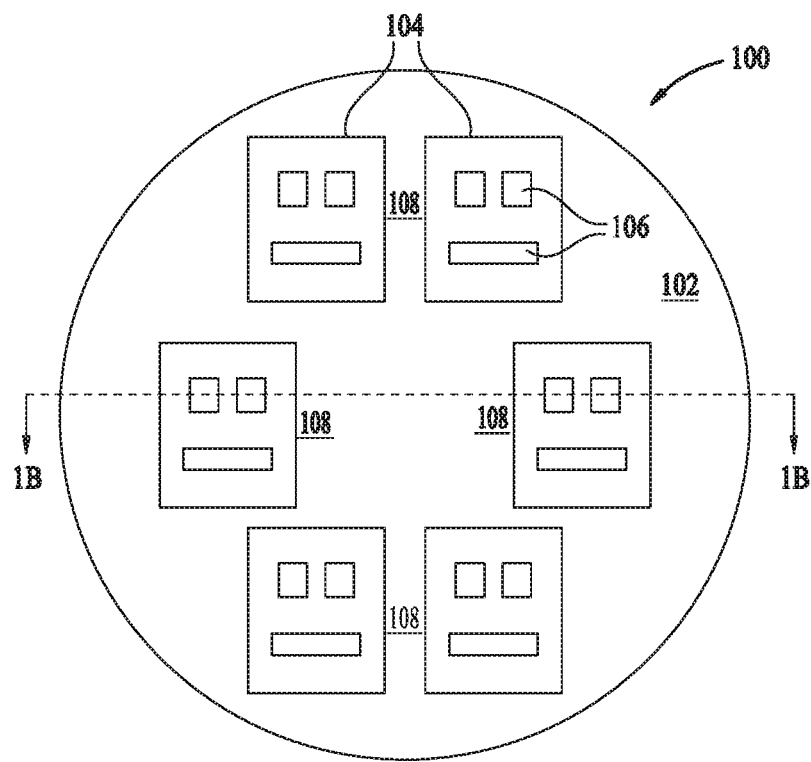
FIG. 1A illustrates a plan view of a substrate with dies having microstructures formed thereon according to an embodiment described herein.

FIG. 1A illustrates a plan view of a substrate 100 with dies having microstructures 106 formed thereon according to a lithography process. In one embodiment, the substrate 100 is formed from a glass or glass-like material, such as quartz or sapphire. In another embodiment, the substrate is formed from a semiconducting material, such as a silicon material or the like. Although the substrate 100 is illustrated as having a substantially circular shape, it is contemplated that the substrate 100 may be polygonal in shape, such as quadrilateral in shape, for example, rectangular or square shaped.

The substrate 100 is illustrated as having a plurality of dies 104 formed thereon. The dies 104 correspond to areas of the substrate 100 which are patterned with desired structures for subsequent utilization in various devices, such as a computing device, an optical device, or the like. The dies 104 include the microstructures 106 formed thereon. The microstructures 106 are features formed on the dies 104 by various fabrication processes, such as lithography processes, for example, NIL processes. Alternatively, the microstructures 106 are features which are etched or deposited on the substrate 100. In one embodiment, the microstructures 106 are grating structures and the die 104 is contemplated to be a waveguide or a portion of a waveguide apparatus.

The dies 104 are arranged on the substrate 100 with kerf areas 108 formed around or between adjacent dies 104. The kerf areas 108 are regions of the substrate surface which are not occupied by the dies 104. The kerf areas 108 substantially surround each individual die 104 and space individual dies 104 from one another. The kerf areas 108 may also extend between individual dies 104 and a perimeter of the substrate 100. In one embodiment, the kerf areas 108 have substantially no microstructures or features formed thereon. In various implementations, the kerf areas 108 are regions which are subsequently removed during dicing operations to separate individual dies 104 during singulation.

Figure 1B:
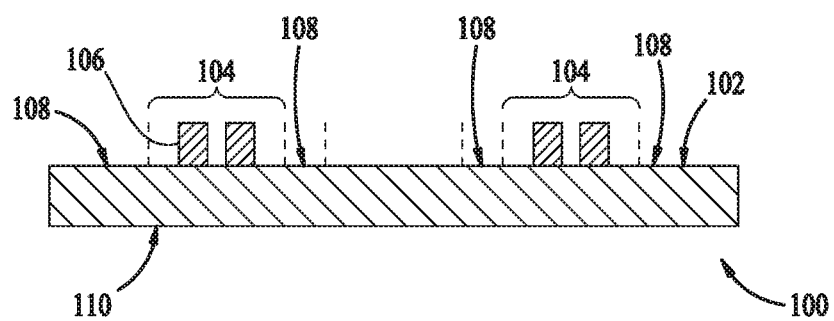
FIG. 1B illustrates a cross-sectional view of the substrate of FIG. 1A taken along line 1B-1B according to an embodiment described herein.

FIG. 1B illustrates a cross-sectional view of the substrate 100 of FIG. 1A taken along line 1B-1B according to an embodiment described herein. As described above, the kerf areas 108 are regions which are disposed between adjacent dies 104. It should be noted that the substrate 100 is illustrated as having the microstructures 106 formed on a first side 102 of the substrate 100. In one embodiment, the microstructures 106 extend a distance of between about 100 um and about 500 um from the first side 102 of the substrate 100. In one embodiment, the first side 102 is the front side of the substrate 100. A second side 110 of the substrate 100 exists opposite and parallel to the first side 102. In the illustrated embodiment, the second side 110 is unprocessed such that no features or microstructures are formed on the second side 110.

Figure 2A:
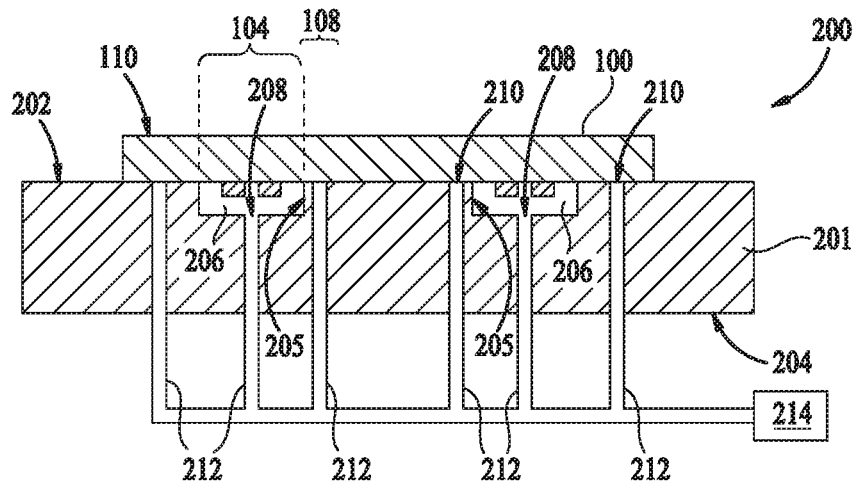
FIG. 2A illustrates a cross-section view of a vacuum chucking apparatus according to an embodiment described herein.

FIG. 2A illustrates a cross-section view of a vacuum chucking apparatus 200 according to an embodiment described herein. The substrate 100 is illustrated as having the first side contacting the vacuum chucking apparatus 200 such that the second side 110 is oriented away from the vacuum chucking apparatus 200 in a position suitable for processing the second side 110.

The vacuum chucking apparatus 200 includes a body 201 having a chucking surface 202 and a bottom surface 204 oriented opposite to the chucking surface 202. In one embodiment, the body 201 is formed from a metallic material, such as aluminum, stainless steel, or alloys, combinations, and mixtures thereof. In another embodiment, the body 201 is formed from a ceramic material, such as a silicon nitride material, an aluminum nitride material, an alumina material, or combinations and mixtures thereof. In certain embodiments, a coating is disposed on the chucking surface 202 of the body 201. The coating, depending upon the desired implementation, is a polymeric material, such as one or more of a polyimide material, a polyamide material, or a polytetrafluoroethylene (PTFE) material.

A plurality of cavities 206 are formed in the body 201. The cavities 206 are disposed within the body 201 and extend into the body 201 from the chucking surface 202. The cavities 206 are defined by a bottom surface 203 and sidewalls 205. A depth of the cavities 206 is between about 100 um and about 1000 um, for example between about 300 um and about 700 um. It is contemplated that the depth of the cavities 206 is sufficient to accommodate the microstructures 106 formed on the substrate 100 such that the microstructures 106 remain out of contact with the body 201 when the substrate 100 is positioned on the vacuum chucking apparatus 200. In one embodiment, the plurality of cavities 206 are formed in a material layer disposed on the body 201.

In one embodiment, a shape of the cavities 206 corresponds to a shape of the dies 104. For example, if the dies 104 are square or rectangular shaped, the shape of the cavities 206 would similarly be square or rectangular in shape. However, it is contemplated that the size of the cavities 206 may be larger or smaller than an area corresponding to the dies 104.

A plurality of first ports 208 are formed in the body 201 and a plurality of second ports (surface ports) 210 are formed in the chucking surface 202 of the body 201. Each of the plurality of first ports 208 are in fluid communication with a respective one of the cavities 206. The plurality of second ports 210 positioned between the cavities 206. The plurality of second ports 210 are also formed in the chucking surface 202 of the body radially outward of the plurality of cavities 206. A plurality of first conduits 212 extend from the plurality of first ports 208 and the plurality of second ports 210 through the body 201 to the bottom surface 204. Each of the first plurality of conduits 212 are coupled to a first vacuum source 214. Thus, the first vacuum source 214 is in fluid communication with the cavities 206 as well as the chucking surface 202 of the body 201 via the first plurality of conduits 212.

Figure 2B:
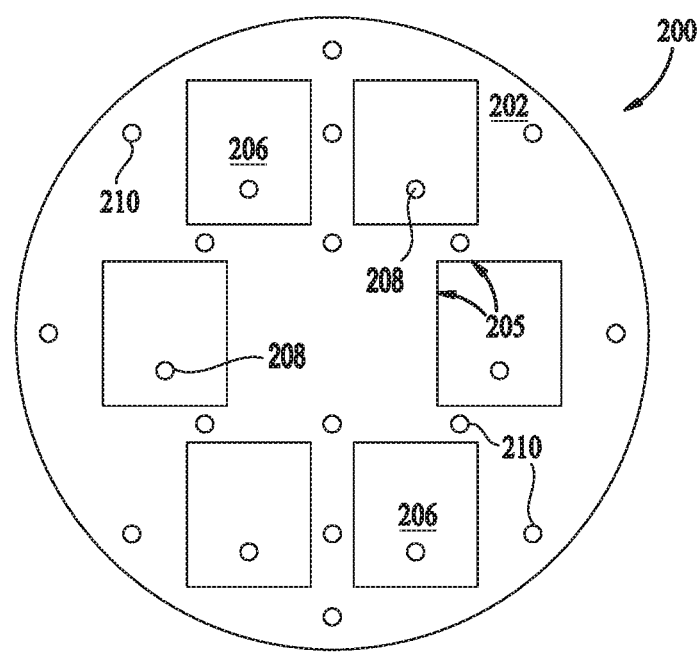
FIG. 2B is a plan view of the vacuum chucking apparatus of FIG. 2A.

FIG. 2B is a plan view of the vacuum chucking apparatus 200 of FIG. 2A. In the illustrated embodiment, the plurality of first ports 208 in the cavities 206 as well as the plurality of second ports 210 at the chucking surface 202 are substantially circular in shape. While circular ports may improve the ease of fabrication of the vacuum chucking apparatus 200, it is contemplated that any port shape may be utilized. Although several second ports 210 are shown distributed across the chucking surface 202 of the body 201, any number, arrangement, or distribution of second ports 210 suitable to enable substantially flat chucking of the substrate 100 are contemplated to be within the scope of this disclosure.

In operation, vacuum pressure is generated by the first vacuum source 214 to chuck the substrate 100 to the body 201 at regions remote from the cavities 206. In addition, the vacuum pressure from the first vacuum source 214 is utilized to stabilize the substrate 100 during processing, particularly at areas corresponding to positions of the microstructures 106 on the substrate 100.

In a lithography process, in particular a SCIL process, a patterned template (patterned from a master pattern) is effectively pressed against a resin layer disposed on the second side 110 of the substrate. For example, the patterned template is provided onto a flexible optically transparent substrate that is pressed at certain intervals and/or pressures against the resin layer on the substrate 100. It is contemplated that vacuum chucking the substrate 100 to the body 201 is sufficient to achieve desirable substrate flatness for applying the patterned template to the second side 110 of the substrate. After the patterned template is applied to the resin on the second side 110 of the substrate, the resin is cured without removing the patterned template and the flexible optically transparent substrate from the second side 110 of the substrate. However, after curing of the resin, the patterned template and the flexible optically transparent substrate are removed from the second side 110 of the substrate. The patterned template and the flexible optically transparent substrate are effectively peeled off of the cured resin layer on the second side 110 of the substrate, which creates bending moments and/or stresses in the substrate 100. The removal process is described in more detail in FIGS. 3A-3C.

Figure 3A:
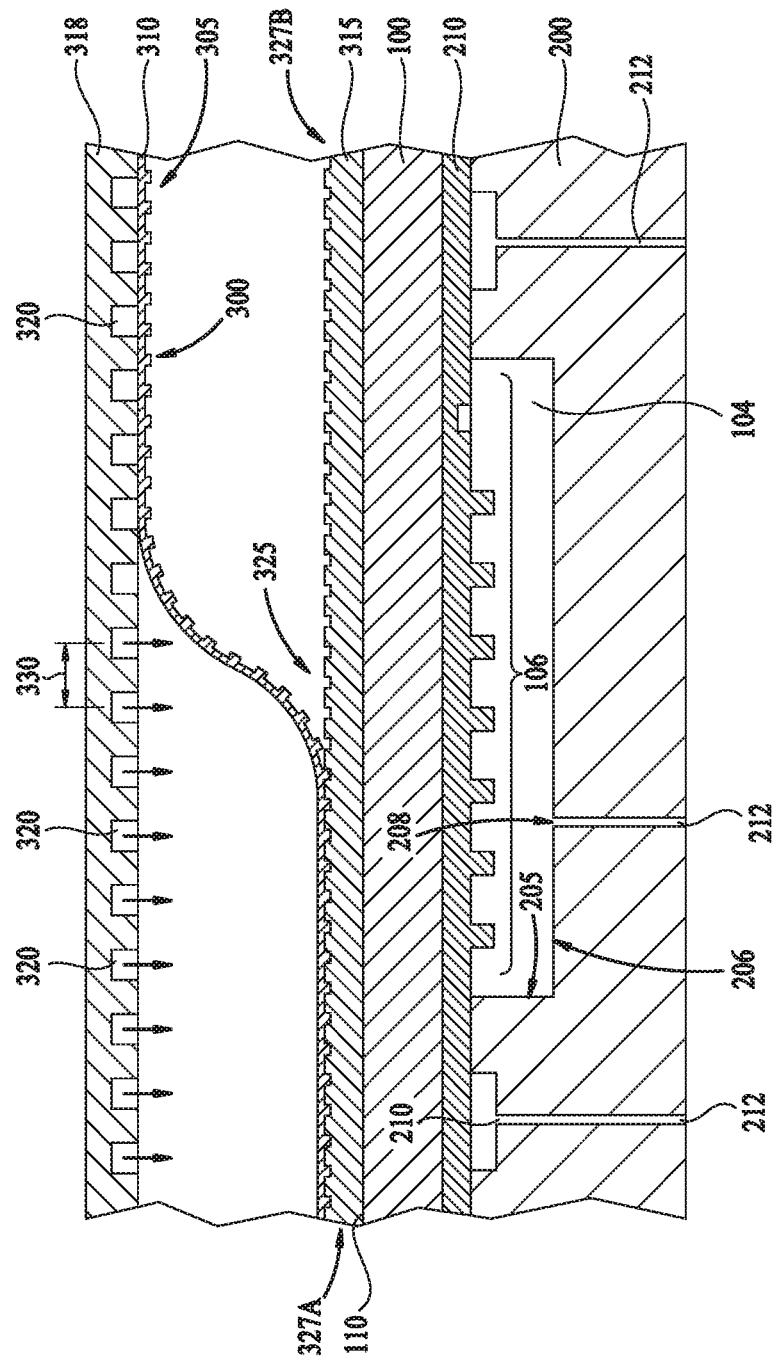
FIG. 3A is a schematic sectional view of a portion of a transfer process of a patterned template onto a substrate.

FIG. 3A is a schematic sectional view of a portion of a transfer process of a patterned template 300 onto the resin layer 315 of the substrate 100. The substrate 100 is chucked to a vacuum chucking apparatus 200 as described herein. The patterned template 300 includes a plurality of features 305 coupled to a flexible optically transparent substrate 310. Each of the plurality of features 305 may be protrusions, depressions, or a combination thereof, which is pressed against a resin layer 315 disposed on the second side 110 of the substrate 100. The patterned template 300 is applied to the resin layer 315 by a plate 318 having a plurality of variable pressure grooves 320 that incrementally applies positive pressure to the patterned template 300 in order to transfer a pattern of structures 325 in or on the resin layer 315. For example, the patterned template 300 is incrementally pressured against the resin layer 315 from a first side 327A of the substrate 100 to an opposing second side 327B of the substrate 100 by selectively applying pressure from the variable pressure grooves 320 of the plate 318.

However, during removal of the patterned template 300, which occurs after the resin layer 315 is cured, the patterned template 300 is peeled away from the resin layer 315 from the second side 327B of the substrate 100 to the first side 327A of the substrate 100 by selectively applying vacuum from the variable pressure grooves 320 of the plate 318. This incremental vacuum application by the plate 318 forms a separation line 330 that moves from the second side 327B of the substrate 100 to the first side 327A of the substrate 100 based on the application of vacuum pressure from the variable pressure grooves 320. The force provided by the variable pressure grooves 320 in pulling the patterned template 300 away from the substrate 100 may dislodge the substrate from the vacuum chucking apparatus 200. Additionally or alternatively, the force provided by the variable pressure grooves 320 in pulling the patterned template 300 away from the substrate 100 may deform the substrate 100 at the separation line 330. If deformation of the substrate 100 exceeds a specified value, the microstructures 106 on the first side 102 of the substrate 100 may be damaged. The vacuum chucking apparatus 200 as described herein is utilized to prevent or minimize deformation of the substrate 100 particularly at positions corresponding to the cavities 206

FIGS. 3B and 3C are sectional view of portions of the vacuum chucking apparatus 200 having the substrate 100 thereon. FIGS. 3B and 3C show a slight deformation in the substrate 100 during removal of the patterned template 300 of FIG. 3A based on different positions of the separation line 330 shown in FIG. 3A. FIG. 3B shows an active cavity 335A depicting the substrate 100 in a convex orientation corresponding to pulling of the substrate 100 at the separation line 330. FIG. 3C shows an idle cavity 335B depicting the substrate 100 in a concave orientation due to vacuum application from the first vacuum source 214 through one of the first ports 208 either before or after the separation line 330 has passed thereacross. The active cavity 335A and the idle cavity 335B are each one of the cavities 206 shown in FIGS. 2A and 2B. In one embodiment, the pressure within each of the active cavity 335A and the idle cavity 335B is the same. However, when the separation line 330 is adjacent to the substrate 100, as described in FIG. 3B, the force of the variable pressure grooves 320 of the plate 318 overcomes the pressure within the active cavity 335A.

However, according to embodiments described herein, the degree of deformation, depicted as reference numeral 340, is kept within specifications utilizing the vacuum chucking apparatus as disclosed herein.

Figure 4A:
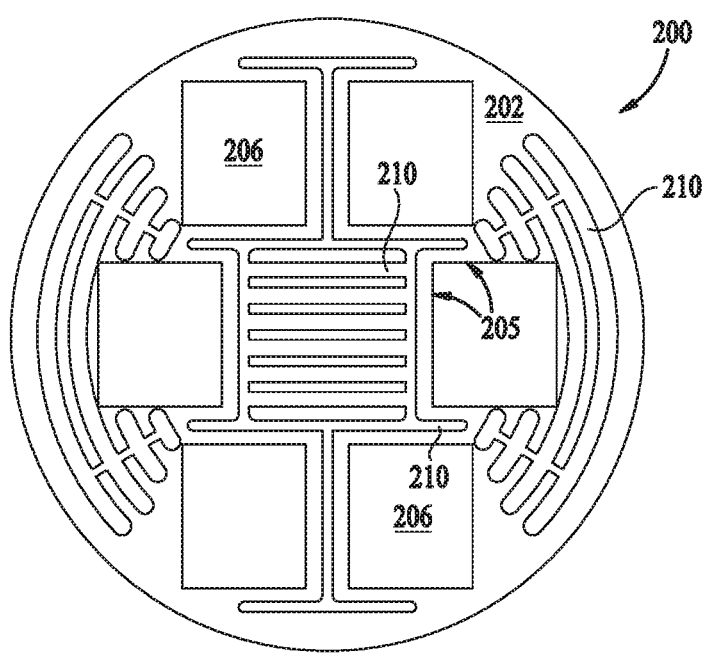
FIG. 4A illustrates a plan view of the vacuum chucking apparatus of FIG. 2 according to an embodiment described herein.

FIG. 4A illustrates a plan view of the vacuum chucking apparatus 200 of FIG. 2 according to an embodiment described herein. The illustrated second (surface) ports 210 are in an irregularly shaped groove pattern to increase the surface area of the substrate exposed to vacuum relative to the embodiment shown in FIGS. 2A and 2B.

Figure 4B:
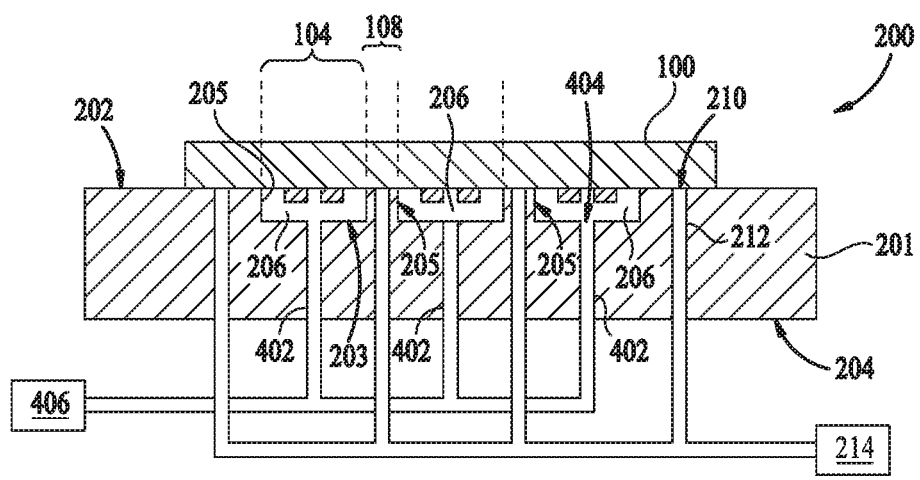
FIG. 4B illustrates a cross-sectional view of the vacuum chucking apparatus of FIG. 4A.

FIG. 4B illustrates a cross-sectional view of the vacuum chucking apparatus 200 of FIG. 4A. In the illustrated embodiment, the vacuum chucking apparatus 200 includes a second plurality of ports 404, a second plurality of conduits 402, and a second vacuum source 406. The second plurality of ports 404 are formed in the bottom surface 203 of the cavities 206 and the second plurality of conduits 402 extend from each of the second plurality of ports 404 through the body 201 to the bottom surface 204. The second plurality of conduits 402 are coupled to the second vacuum source 406 accordingly.

In operation, the vacuum chucking apparatus 200 of FIGS. 4A and 4B enables differential pressure chucking of the substrate 100. The first vacuum source 214, which is in fluid communication with the substrate 100 via the first plurality of conduits 212 and the first plurality of ports 210, generates a first vacuum pressure to chuck the substrate to the chucking surface 202 of the body 201. The second vacuum source 406, which is in fluid communication with the cavities 206 via the second plurality of conduits 402 and the second plurality of ports 404, generates a second vacuum pressure to further reduce a pressure with the cavities 206 and reduce or eliminate the degree of deformation of the substrate 100. It is contemplated that the first vacuum pressure may be greater than, less than, or equal to the second vacuum pressure, depending upon desired chucking characteristics. In some implementations, the first vacuum pressure and the second vacuum pressure may be below ambient pressure where the vacuum chucking apparatus 200 is in operation. The ambient pressure may be atmospheric pressure (e.g., at or about 760 millimeters mercury (mmHg)).

Figure 5B:
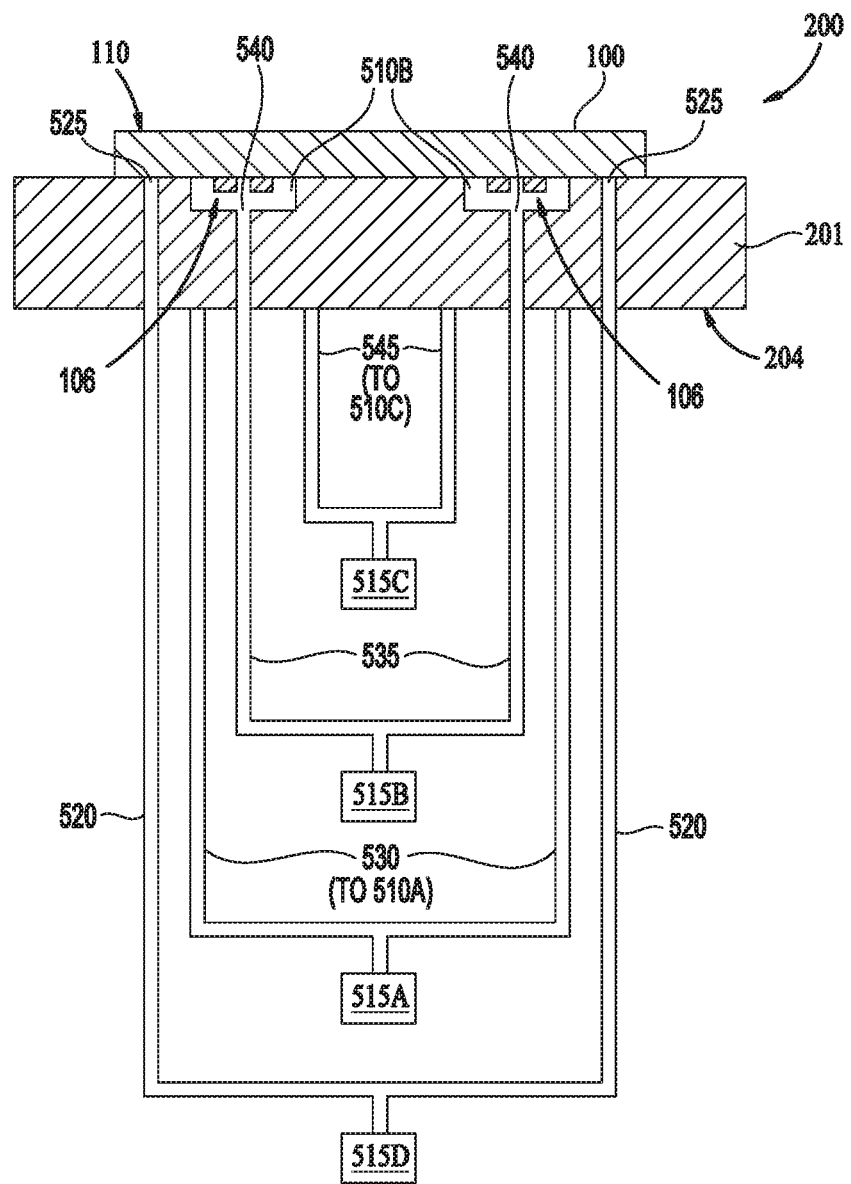
FIG. 5B is a schematic sectional view of the vacuum chucking apparatus along lines 5B-5B of FIG. 5A.

FIG. 5A illustrates a plan view of the vacuum chucking apparatus 200 of FIG. 2 according to an embodiment described herein. FIG. 5B is a schematic sectional view of the vacuum chucking apparatus 200 along lines 5B-5B of FIG. 5A. In this embodiment, the vacuum chucking apparatus 200 is provided with multiple pressure zones which includes a first pressure zone 500A, a second pressure zone 500B, a third pressure zone 500C and a fourth pressure zone 500D. The fourth pressure zone 500D is defined by a groove pattern 505 that is utilized to chuck portions of a substrate 100 not having microstructures 106 formed thereon. The cavities 206, shown as cavities 510A-510C, are utilized to chuck portions of the substrate having the microstructures 106 as described above. Each of the cavities 510A-510C are in fluid communication with a first vacuum source 515A, a second vacuum source 515B and a third vacuum source 515C, and the groove pattern 505 is in fluid communication with a fourth vacuum source 515D. Each of the vacuum sources 515A-515D are independently controlled.

As shown in FIG. 5B, a plurality of first conduits 520 are coupled to the fourth vacuum source 515D. A surface opening 525 of each of the plurality of first conduits 520 is in fluid communication with the groove pattern 505 of FIG. 5A, which is utilized to chuck portions of the substrate 100 that are not disposed over the cavities 510A-510C. A plurality of second conduits 530 are coupled to the cavities 510A (not shown in the side view of FIG. 5B) and the first vacuum source 515A. A plurality of third conduits 535 are coupled to the cavities 510B and the second vacuum source 515B. An opening 540 of each of the plurality of third conduits 535 provide negative pressure application to the exposed portions of the substrate 100 in the cavities 510B. A plurality of fourth conduits 545 are coupled to the cavities 510C (not shown in the side view of FIG. 5B) and the third vacuum source 515C. While not shown in the side view of FIG. 5B, the plurality of second conduits 530 and the plurality of fourth conduits 545 include openings, similar to the openings 540, which provide negative pressure application to the exposed portions of the substrate 100 in the cavities 510A and 510C, respectively.

Pressure in the fourth pressure zone 500D may remain constant while the pressure in the first pressure zone 500A, the second pressure zone 500B and the third pressure zone 500C is individually controlled. The pressures in the first pressure zone 500A, the second pressure zone 500B and the third pressure zone 500C may be varied based on the position of the separation line 330. For example, when the separation line 330 is positioned over the substrate at the locations of the cavities 510A as shown in the first pressure zone 500A, pressure is lower in the cavities 510A as compared to a pressure of the cavities 5106 and 510C. However, when the separation line 330 moves across the substrate, such as above the cavities 510B in the second pressure zone 500B, the pressure of the cavities 510A and 510C is higher than a pressure of the cavities 510B. Similarly, when the separation line 330 is above the cavities 510C, the pressure is lower in the cavities 510C as compared to a pressure of the cavities 510A and 510B.

Figure 6:
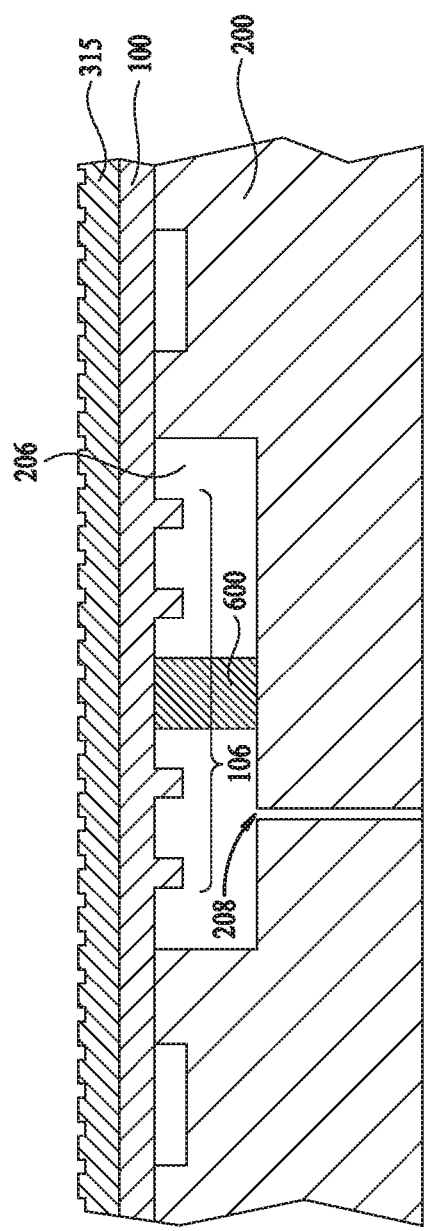
FIG. 6 illustrates a sectional view of a portion of a vacuum chucking apparatus according to an embodiment described herein.

FIG. 6 illustrates a sectional view of a portion of a vacuum chucking apparatus 200 according to an embodiment described herein. In this embodiment, a cavity 206 is provided with a support member 600. The support member 600 is utilized to enable use of lower pressure within the cavity 206 while reducing or eliminating the degree of deformation 340 of the substrate 100. The support member 600 may be a removable feature or may be formed as a portion of the vacuum chucking apparatus 200. The support member 600 may be used with certain types of microstructures 106 where contact of the substrate 100 with the support member 600 does not damage the microstructures 106.

In summation, a substrate chucking apparatus having cavities formed therein enables chucking of substrates with surfaces having microstructures formed thereon for dual sided substrate processing. The chucking apparatus include various vacuum chucking elements as described above that are utilized to reduce or eliminate the degree of deformation 340 of the substrate 100 during processing.

While the foregoing is directed to embodiments of the present disclosure, other and further embodiments of the disclosure may be devised without departing from the basic scope thereof, and the scope thereof is determined by the claims that follow.

What is claimed is:

1. A method for processing a substrate, the method comprising:
   positioning a substrate having a first surface on a chuck, the first surface having a plurality of structures formed thereon, wherein each of the plurality of structures are positioned in a respective cavity formed in a chucking surface of the chuck;
   applying a first pressure to the first surface through a plurality of ports formed in the chucking surface while applying a second pressure in pairs of the cavities, the first pressure being different than the second pressure; and
   forming a plurality of structures on a second surface of the substrate.

2. The method of claim 1, wherein the cavities include a first pair of cavities and a second pair of cavities.

3. The method of claim 2, wherein the first pair of cavities is coupled to a first conduit and the second pair of cavities is coupled to a second conduit.

4. The method of claim 3, wherein the first conduit is coupled to a first vacuum source and the second conduit is coupled to a second vacuum source.

5. The method of claim 1, wherein each of the plurality of surface ports are in fluid communication with a groove pattern formed in the chucking surface.

6. The method of claim 5, wherein the groove pattern surrounds a portion of the cavities.

7. The method of claim 1, wherein the forming the plurality of structures on the second surface comprises:
   forming a resin layer on the second surface; and
   transferring a pattern from a template onto the resin layer.

8. The method of claim 7, wherein the template is coupled to a plate by a plurality of variable pressure grooves.

9. The method of claim 8, further comprising:
   removing the template from the resin layer by incrementally applying a negative pressure to the variable pressure grooves.

10. A method for processing a substrate, the method comprising:
    positioning a first surface of a substrate having a plurality of structures formed thereon on a chuck, wherein the chuck includes a plurality of cavities formed in a chucking surface of the chuck that corresponds to a pattern of the plurality of structures formed on the substrate;
    applying a first pressure to the first surface through a plurality of ports formed in the chucking surface while applying a second pressure in pairs of the cavities, the first pressure being different than the second pressure; and forming a plurality of structures on a second surface of the substrate, wherein the forming the plurality of structures on the second surface comprises:

forming a resin layer on the second surface; and transferring a pattern from a template onto the resin layer.

11. The method of claim 10, wherein the template is coupled to a plate by a plurality of variable pressure grooves.

12. The method of claim 11, further comprising:

removing the template from the resin layer by incrementally applying a negative pressure to the variable pressure grooves while minimizing deformation of the substrate.

13. The method of claim 10, wherein the cavities include a first pair of cavities and a second pair of cavities.

14. The method of claim 13, wherein the first pair of cavities is coupled to a first conduit and the second pair of cavities is coupled to a second conduit.

15. The method of claim 14, wherein the first conduit is coupled to a first vacuum source and the second conduit is coupled to a second vacuum source.

16. A method for processing a substrate, the method comprising:

positioning a first surface of a substrate having a plurality of structures formed thereon on a chuck, wherein the chuck includes a plurality of cavities formed in a chucking surface of the chuck that corresponds to a pattern of the plurality of structures formed on the substrate;

applying a first pressure to the first surface through a plurality of ports formed in the chucking surface while applying a second pressure in pairs of the cavities, the first pressure being different than the second pressure; and forming a plurality of structures on a second surface of the substrate, wherein the forming the plurality of structures on the second surface comprises:

forming a resin layer on the second surface;

transferring a pattern from a template onto the resin layer; and removing the template from the resin layer while varying pressures in each of the plurality of cavities.

17. The method of claim 16, wherein the cavities include a first pair of cavities and a second pair of cavities.

18. The method of claim 17, wherein the first pair of cavities is coupled to a first conduit and the second pair of cavities is coupled to a second conduit.

19. The method of claim 18, wherein the first conduit is coupled to a first vacuum source and the second conduit is coupled to a second vacuum source.

20. The method of claim 16, wherein the template is coupled to a plate by a plurality of variable pressure grooves.

* * * * *